(12) United States Patent
Wang et al.

(10) Patent No.: US 11,955,084 B2
(45) Date of Patent: Apr. 9, 2024

(54) GATE DRIVER CIRCUIT AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Xuanyun Wang, Wuhan (CN); Chao Dai, Wuhan (CN); Jianlong Wu, Wuhan (CN); Ruiting He, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/434,717

(22) PCT Filed: Jul. 13, 2021

(86) PCT No.: PCT/CN2021/105943
§ 371 (c)(1),
(2) Date: Aug. 27, 2021

(87) PCT Pub. No.: WO2022/262037
PCT Pub. Date: Dec. 22, 2022

(65) Prior Publication Data
US 2024/0021163 A1    Jan. 18, 2024

(30) Foreign Application Priority Data

Jun. 18, 2021 (CN) .......................... 202110676750.0

(51) Int. Cl.
*G09G 3/3266* (2016.01)
*G09G 3/3225* (2016.01)

(52) U.S. Cl.
CPC ......... *G09G 3/3266* (2013.01); *G09G 3/3225* (2013.01)

(58) Field of Classification Search
CPC ............................ G09G 3/3266; G09G 3/3225
See application file for complete search history.

(56) References Cited

U.S. PATENT DOCUMENTS

2016/0329015 A1   11/2016   Ji et al.
2017/0092172 A1*   3/2017   Wang ....................... G09G 3/20
(Continued)

FOREIGN PATENT DOCUMENTS

CN       105118417 A       12/2015
CN       107274838 A       10/2017
(Continued)

OTHER PUBLICATIONS

Chinese Office Action issued in corresponding Chinese Patent Application No. 202110676750.0 dated Jan. 19, 2022, pp. 1-7.
(Continued)

*Primary Examiner* — Brent D Castiaux
(74) *Attorney, Agent, or Firm* — PV IP PC; Wei Te Chung; Zhigang Ma (57) ABSTRACT

A driving circuit and a display panel are provided. The gate driver circuit includes a plurality of gate driving units which are cascaded. An Nth stage gate driving unit includes a pull-down control module, a pull-down module, a pull-up control module, a first pull-up voltage stabilizing module, a pull-up module, a second pull-up voltage stabilizing module, and a pull-down voltage stabilizing module. Stability of the gate driver circuit can be improved by increasing stability of a voltage level at a fourth node via the first pull-up voltage stabilizing module and the second pull-up voltage stabilizing module.

20 Claims, 4 Drawing Sheets

(56) References Cited

U.S. PATENT DOCUMENTS

| | | | |
|---|---|---|---|
| 2017/0162145 A1 | 6/2017 | Huang | |
| 2017/0294165 A1* | 10/2017 | Park | G09G 3/3266 |
| 2018/0330667 A1* | 11/2018 | Yuan | G09G 3/3266 |
| 2019/0156776 A1 | 5/2019 | Shi | |
| 2019/0259338 A1 | 8/2019 | Yafeng | |
| 2021/0118347 A1* | 4/2021 | Wang | G09G 3/3266 |

FOREIGN PATENT DOCUMENTS

| | | |
|---|---|---|
| CN | 108630167 A | 10/2018 |
| CN | 109427285 A | 3/2019 |
| CN | 111415624 A | 7/2020 |
| CN | 111681625 A | 9/2020 |
| CN | 111681626 A | 9/2020 |
| CN | 111754923 A | 10/2020 |
| CN | 112365855 A | 2/2021 |
| CN | 112509531 A | 3/2021 |
| CN | 112542131 A | 3/2021 |
| KR | 20160077315 A | 7/2016 |
| KR | 20190032959 A | 3/2019 |

OTHER PUBLICATIONS

International Search Report in International application No. PCT/CN2021/105943, dated Mar. 15, 2022.

\* cited by examiner

|     |     | Vgs (V) | Vgd (V) | Vds (V) |
| --- | --- | --- | --- | --- |
| T1  | S10 | 0 | 5 | -5 |
|     | S20 | 33 | 35 | -25 |
| T2  | S10 | 0 | 20 | -20 |
|     | S20 | -34 | -34 | 0 |

GATE DRIVER CIRCUIT AND DISPLAY PANEL

RELATED APPLICATIONS

This application is a Notional Phase of PCT Patent Application No. PCT/CN2021/105943 having international filing date of Jul. 13, 2021, which claims the benefit of priority of Chinese Patent Application No. 202110676750.0 filed on Jun. 18, 2021. The contents of the above applications are all incorporated by reference as if fully set forth herein in their entirety.

TECHNICAL FIELD

The present disclosure relates to the display technology field, and more particularly to a gate driver circuit and a display panel.

BACKGROUND ART

In a gate driver circuit, a process of manufacturing a thin film transistor array substrate can be used to fabricate gate row scan driving technology on the array substrate, thereby implementing a driving method of scanning gate lines.

The gate driver circuit is used as a driving circuit of a display panel. Whether voltage levels of key nodes in the gate driver circuit are stable directly affects the stability of an output signal, and further affects the working reliability of the display panel.

It should be noted that the above-mentioned introduction of the background art is only to facilitate a clear and complete understanding of the technical solutions of the present disclosure. Accordingly, it cannot be considered that the above-mentioned technical solutions are known to those skilled in the art just because it appears in the background art of the present disclosure.

Technical Problem

The present disclosure provides a driving circuit and a display panel for easing the technical problem that a gate driver circuit does not work stably.

Technical Solution

In a first aspect, the present disclosure a gate driver circuit. The gate driver circuit includes a plurality of gate driving units which are cascaded. Each of the gate driving units is configured to output a corresponding scan signal. Each of the gate driving units includes: a first wiring, a second wiring, a third wiring, a fourth wiring, a fifth wiring, a sixth wiring, a pull-down control module, a pull-down module, a pull-up control module, a first pull-up voltage stabilizing module, a pull-up module, a second pull-up voltage stabilizing module, and a pull-down voltage stabilizing module. An input terminal of the pull-down control module is electrically connected to the first wiring, a control terminal of the pull-down control module is electrically connected to the second wiring and the third wiring, and an output terminal of the pull-down control module is electrically connected to a first node. A control terminal of the pull-down module is electrically connected to the first node, an input terminal of the pull-down module is electrically connected to the fourth wiring, and an output terminal of the pull-down module is electrically connected to a second node to output the corresponding scan signal. An input terminal of the pull-up control module is electrically connected to the third wiring and the fourth wiring, a control terminal of the pull-up control module is electrically connected to the first node and the third wiring, and an output terminal of the pull-up control module is electrically connected to a third node. An input terminal of the first pull-up voltage stabilizing module is electrically connected to the second wiring and the third wiring, a control terminal of the first pull-up voltage stabilizing module is electrically connected to the first node, the third node, and the third wiring, and an output terminal of the first pull-up voltage stabilizing module is electrically connected to a fourth node. An input terminal of the pull-up module is electrically connected to the second wiring, a control terminal of the pull-up module is electrically connected to the fourth node, and an output terminal of the pull-up module is electrically connected to the second node. One terminal of the second pull-up voltage stabilizing module is electrically connected to the second wiring, and the other terminal of the second pull-up voltage stabilizing module is electrically connected to the fourth node. An input terminal of the pull-down voltage stabilizing module is electrically connected to the fifth wiring and the sixth wiring, a control terminal of the pull-down voltage stabilizing module is electrically connected to the first node and the third node, and an output terminal of the pull-down voltage stabilizing module is electrically connected to the first node.

In some embodiments, the pull-down control module includes a first transistor, and a second transistor. One of source/drain electrodes of the first transistor is electrically connected to the first wiring, and a gate electrode of the first transistor is electrically connected to the second wiring. One of source/drain electrodes of the second transistor is electrically connected to the other of the source/drain electrodes of the first transistor, a gate electrode of the second transistor is electrically connected to the third wiring, and the other of the source/drain electrodes of the second transistor is directly electrically connected to the first node.

In some embodiments, the pull-down module includes a third transistor. A gate electrode of the third transistor is electrically connected to the first node, one of source/drain electrodes of the third transistor is electrically connected to the fourth wiring, and the other of the source/drain electrodes of the third transistor is electrically connected to the second node.

In some embodiments, the pull-up control module includes a fourth transistor and a fifth transistor. One of source/drain electrodes of the fourth transistor is electrically connected to the third wiring, a gate electrode of the fourth transistor directly is electrically connected to the first node, and the other of the source/drain electrodes of the fourth transistor is electrically connected to the third node. One of source/drain electrodes of the fifth transistor is electrically connected to the fourth wiring, a gate of the fifth transistor is electrically connected to the third wiring, and the other of the source/drain electrodes of the fifth transistor is electrically connected to the third node.

In some embodiments, the first pull-up voltage stabilizing module includes a sixth transistor, a seventh transistor, an eighth transistor, and a first capacitor. One of source/drain electrodes of the sixth transistor is electrically connected to the third wiring, and a gate electrode of the sixth transistor is electrically connected to the third node. One of source/drain electrodes of the seventh transistor is electrically connected to the other of the source/drain electrodes of the sixth transistor, a gate electrode of the seventh transistor is electrically connected to the third wiring, and the other of the source/drain electrodes of the seventh transistor is electrically connected to the fourth node. One of source/drain electrodes of the eighth transistor is electrically connected to the second wiring, a gate of the eighth transistor is electrically connected to the first node, and the other of the source/drain electrodes of the eighth transistor is electrically connected to the fourth node. One terminal of the first capacitor is electrically connected to the gate electrode of the sixth transistor, and the other terminal of the first capacitor is electrically connected to the other of the source/drain electrodes of the sixth transistor.

In some embodiments, the pull-up module includes a ninth transistor. One of source/drain electrodes of the ninth transistor electrically is connected to the second wiring, a gate electrode of the ninth transistor is electrically connected to the fourth node, and the other of the source/drain electrodes of the ninth transistor is electrically connected to the second node.

In some embodiments, the second pull-up voltage stabilizing module includes: a second capacitor. A first terminal of the second capacitor is electrically connected to the second wiring, and a second terminal of the second capacitor is electrically connected to the fourth node.

In some embodiments, the pull-down regulator module includes a tenth transistor, an eleventh transistor, and a third capacitor. One of source/drain electrodes of the tenth transistor is electrically connected to the sixth wiring, and a gate electrode of the tenth transistor is electrically connected to the third node. One of source/drain electrodes of the eleventh transistor is electrically connected to the other of the source/drain electrodes of the tenth transistor, a gate electrode of the eleventh transistor is electrically connected to the first node, and the other of the source/drain electrodes of the eleventh transistor is electrically connected to the fifth wiring. One terminal of the third capacitor is electrically connected to the one of the source/drain electrodes of the eleventh transistor, and the other terminal of the third capacitor is electrically connected to the first node.

In some embodiments, the Nth stage gate driver circuit further includes a voltage stabilizing isolation module. An input terminal of the stabilizing isolation module is electrically connected to the third node, a control terminal of the voltage stabilizing isolation module is electrically connected to the four wiring, and an output terminal of the voltage stabilizing isolation module is electrically connected to the first pull-up voltage stabilizing module.

In some embodiments, the voltage stabilizing isolation module includes a twelfth transistor. One of source/drain electrodes of the twelfth transistor is electrically connected to the third node, a gate electrode of the twelfth transistor is electrically connected to the fourth wiring, and the other of the source/drain of the twelfth transistor is electrically connected to the first pull-up voltage stabilizing module.

In some embodiments, the fourth transistor and the fifth transistor are P-channel type thin film transistors.

In a second aspect, the present disclosure provides a display panel including the gate driver circuit in any one of the above-mentioned embodiments.

Advantageous Effects

The gate driver circuit and the display panel provided by the present embodiment can improve stability of a voltage level of an output signal of the gate driver circuit by increasing stability of a voltage level at the fourth node via the first pull-up voltage stabilizing module and the second pull-up voltage stabilizing module and by increasing stability of a voltage level at the fifth node via the pull-down voltage stabilizing module. A topology of the gate driver circuit is simplified, and thus space occupied by a frame of the display panel can be reduced. This is beneficial for implementing a narrow border of the display panel.

DETAILED DESCRIPTION OF EMBODIMENTS

To make the objectives, technical schemes, and technical effects of the present disclosure more clearly and definitely, the present disclosure will be described in details below by using embodiments in conjunction with the appending drawings. It should be understood that the specific embodiments described herein are merely for explaining the present disclosure but are not intended to limit the present disclosure.

Figure 1:
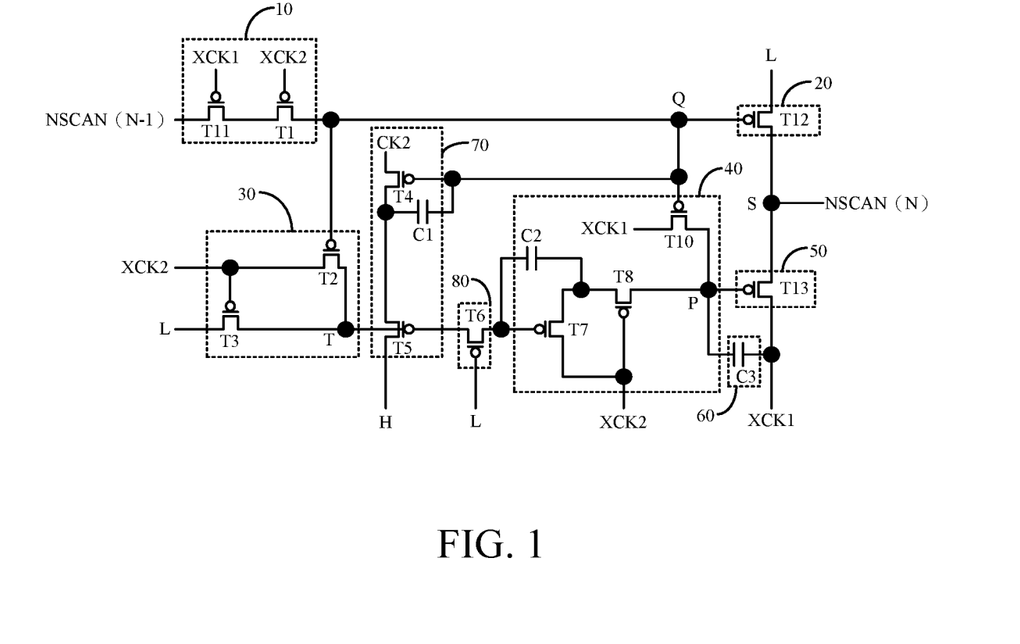
FIG. 1 illustrates a structural diagram of a gate driver circuit provided by one embodiment of the present disclosure.

Please refer to FIGS. 1 to 5. As shown in FIG. 1, one embodiment provides a gate driver circuit. The gate driver circuit includes a plurality of gate driving units which are cascaded. An Nth stage gate driving unit includes a first wiring, a second wiring, a third wiring, a fourth wiring, a fifth wiring, a sixth wiring, a pull-down control module 10, a pull-down module 20, a pull-up control module 30, a first pull-up voltage stabilizing module 40, a pull-up module 50, a second pull-up voltage stabilizing module 60, and a pull-down voltage stabilizing module 70. An input terminal of the pull-down control module 10 is electrically connected to the first wiring. A control terminal of the pull-down control module 10 is electrically connected to the second wiring and the third wiring. An output terminal of the pull-down control module 10 is electrically connected to a first node Q. A control terminal of the pull-down module 20 is electrically connected to the first node Q. An input terminal of the pull-down module 20 is electrically connected to the fourth wiring. An output terminal of the pull-down module 20 is electrically connected to a second node S to output a corresponding Nth level scan signal NSCAN(N). An input terminal of the pull-up control module 30 is electrically connected to the third wiring and the fourth wiring. A control terminal of the pull-up control module 30 is electrically connected to the first node Q and the third wiring. An output terminal of the pull-up control module 30 is electrically connected to a third node T. An input terminal of the first pull-up voltage stabilizing module 40 is electrically connected to the second wiring and the third wiring. A control terminal of the first pull-up voltage stabilizing module 40 is electrically connected to the first node Q, the third node T, and the third wiring. An output terminal of the first pull-up voltage stabilizing module 40 is electrically connected to a fourth node P. An input terminal of the pull-up module 50 is electrically connected to the second wiring. A control terminal of the pull-up module 50 is electrically connected to the fourth node P. An output terminal of the pull-up module 50 is electrically connected to the second node S. One terminal of the second pull-up voltage stabilizing module 60 is electrically connected to the second wiring, and the other terminal of the second pull-up voltage stabilizing module 60 is electrically connected to the fourth node P. An input terminal of the pull-down voltage stabilizing module 70 is electrically connected to the fifth wiring and the sixth wiring. A control terminal of the pull-down voltage stabilizing module 70 is electrically connected to the first node Q and the third node T. An output terminal of the pull-down voltage stabilizing module 70 is electrically connected to the first node Q. N is a positive integer.

It can be understood that the gate driver circuit provided by the present embodiment can improve stability of a voltage level of an output signal of the gate driver circuit by increasing stability of a voltage level at the fourth node P via the first pull-up voltage stabilizing module 40 and the second pull-up voltage stabilizing module 60 and by increasing stability of a voltage level at the fifth node Q via the pull-down voltage stabilizing module 70. A topology of the gate driver circuit is simplified, and thus space occupied by a frame of a display panel can be reduced. This is beneficial for implementing a narrow border of the display panel.

It should be noted that in the present embodiment, the first wiring can be configured to transmit an (N-1)th scan signal NSCAN(N-1), the second wiring can be configured to transmit a clock signal XCK1, the third wiring can be configured to transmit a clock signal XCK2, the fourth wiring can be configured to transmit a low voltage level signal L which can be configured to control a P-channel type thin film transistor to be turned on, the fifth wiring can be configured to transmit a clock signal CK2, and the sixth wiring can be configured to transmit a high voltage level signal H which can be configured to control the P-channel type thin film transistor to be turned off.

The clock signal XCK1 and the clock signal CK2 can be a set of inverted clock signals. That is, when the clock signal XCK1 is at a high voltage level, the clock signal CK2 is at a low voltage level. When the clock signal XCK1 is at a low voltage level, the clock signal CK2 is at a high voltage level. The clock signal XCK2 and a clock signal CK1 can be a set of inverted clock signals. That is, when the clock signal XCK2 is at a high voltage level, the clock signal CK1 is at a low voltage level. When the clock signal XCK2 is at a low voltage level, the clock signal CK1 is at a voltage level. The above-mentioned clock signals can be referred to the following detailed descriptions.

When N is equal to 1, the first wiring can also be voltage configured to transmit an initial signal.

The N-th level scan signal NSCAN(N) can be connected to a gate electrode of an N-channel type thin film transistor. The Nth stage scan signal NSCAN(N) at a high voltage level state can be configured to turn on a corresponding N-channel type thin film transistor.

In one embodiment, the Nth stage gate driving unit further includes a voltage stabilizing isolation module 80. An input terminal of the stabilizing isolation module 80 is electrically connected to the third node T. A control terminal of the voltage stabilizing isolation module 80 is electrically connected to the four wiring. An output terminal of the voltage stabilizing isolation module 80 is electrically connected to the first pull-up voltage stabilizing module 40.

In one embodiment, the pull-down control module 10 includes a first transistor T11 and a second transistor T1. One of source/drain electrodes of the first transistor T11 is electrically connected to the first wiring. A gate electrode of the first transistor T11 is electrically connected to the second wiring. One of source/drain electrodes of the second transistor T1 is electrically connected to the other of the source/drain electrodes of the first transistor T11. A gate electrode of the second transistor T1 is electrically connected to the third wiring. The other of the source/drain electrodes of the second transistor T1 is directly electrically connected to the first node Q.

In one embodiment, the pull-down module 20 includes a third transistor T12. A gate electrode of the third transistor T12 is electrically connected to the first node Q. One of source/drain electrodes of the third transistor T12 is electrically connected to the fourth wiring. The other of the source/drain electrodes of the third transistor T12 is electrically connected to the second node S.

In one embodiment, the pull-up control module 30 includes a fourth transistor T2 and a fifth transistor T3. One of source/drain electrodes of the fourth transistor T2 is electrically connected to the third wiring. A gate electrode of the fourth transistor T2 is directly electrically connected to the first node Q. The other of the source/drain electrodes of the fourth transistor T2 is electrically connected to the third node T. One of source/drain electrodes of the fifth transistor T3 is electrically connected to the fourth wiring. A gate of the fifth transistor T3 is electrically connected to the third wiring. The other of the source/drain electrodes of the fifth transistor T3 is electrically connected to the third node T.

In one embodiment, the first pull-up voltage stabilizing module 40 includes a sixth transistor T7, a seventh transistor T8, an eighth transistor T10, and a first capacitor C2. One of source/drain electrodes of the sixth transistor T7 is electrically connected to the third wiring. A gate electrode of the sixth transistor T7 is electrically connected to the third node T. One of source/drain electrodes of the seventh transistor T8 is electrically connected to the other of the source/drain electrodes of the sixth transistor T7. A gate electrode of the seventh transistor T8 is electrically connected to the third wiring. The other of the source/drain electrodes of the seventh transistor T8 is electrically connected to the fourth node P. One of source/drain electrodes of the eighth transistor T10 is electrically connected to the second wiring. A gate of the eighth transistor T10 is electrically connected to the first node Q. The other of the source/drain electrodes of the eighth transistor T10 is electrically connected to the fourth node P. One terminal of the first capacitor C2 is electrically connected to the gate electrode of the sixth transistor T7, and the other terminal of the first capacitor C2 is electrically connected to the other of the source/drain electrodes of the sixth transistor T7.

It can be understood that due to the existence of the first capacitor C2, the voltage level at the first node Q and a voltage level at the third node T can remain stable more easily, thereby improving the stability of the output signal of the gate driver circuit.

In one embodiment, the pull-up module 50 includes a ninth transistor T13. One of source/drain electrodes of the ninth transistor T13 is electrically connected to the second wiring. A gate electrode of the ninth transistor T13 is electrically connected to the fourth node P. The other of the source/drain electrodes of the ninth transistor T13 is electrically connected to the second node S.

In one embodiment, the second pull-up voltage stabilizing module 60 includes a second capacitor C3. A first terminal of the second capacitor C3 is electrically connected to the second wiring, and a second terminal of the second capacitor C3 is electrically connected to the fourth node P.

It can be understood that due to the existence of the second capacitor C3, the voltage level at the fourth node P can remain stable more easily, thereby improving the stability of the output signal of the gate driver circuit.

In one embodiment, the pull-down regulator module 70 includes a tenth transistor T5, an eleventh transistor T4, and a third capacitor C1. One of source/drain electrodes of the tenth transistor T5 is electrically connected to the sixth wiring. A gate electrode of the tenth transistor T5 is electrically connected to the third node T. One of source/drain electrodes of the eleventh transistor T4 is electrically connected to the other of the source/drain electrodes of the tenth transistor T5. A gate electrode of the eleventh transistor T4 is electrically connected to the first node Q. The other of the source/drain electrodes of the eleventh transistor T4 is electrically connected to the fifth wiring. One terminal of the third capacitor C1 is electrically connected to the one of the source/drain electrodes of the eleventh transistor T4, and the other terminal of the third capacitor C1 is electrically connected to the first node Q.

It can be understood that due to the existence of the third capacitor C1, the voltage level at the first node Q can remain stable more easily, thereby improving the stability of the output signal of the gate driver circuit.

In one of the embodiments, the voltage stabilizing isolation module 80 includes a twelfth transistor T6. One of source/drain electrodes of the twelfth transistor T6 is electrically connected to the third node T. A gate electrode of the twelfth transistor T6 is electrically connected to the fourth wiring. The other of the source/drain of the twelfth transistor T6 is electrically connected to the gate electrode of the sixth transistor T7.

It can be understood that due to the existence of the twelfth transistor T6, the voltage level at the third node T and a voltage level at the other of the source/drain electrodes of the twelfth transistor T6 can be isolated from each other, and stability between the voltage levels can remain. Accordingly, the stability of the output signal of the gate driver circuit can be further improved.

In one embodiment, at least one of the first transistor T11, the second transistor T1, the third transistor T12, the fourth transistor T2, the fifth transistor T3, the sixth transistor T7, the seventh transistor T8, the eighth transistor T10, the ninth transistor T13, the tenth transistor T5, the eleventh transistor T4, and the twelfth transistor T6 is a P-channel type thin film transistor.

Figure 2:
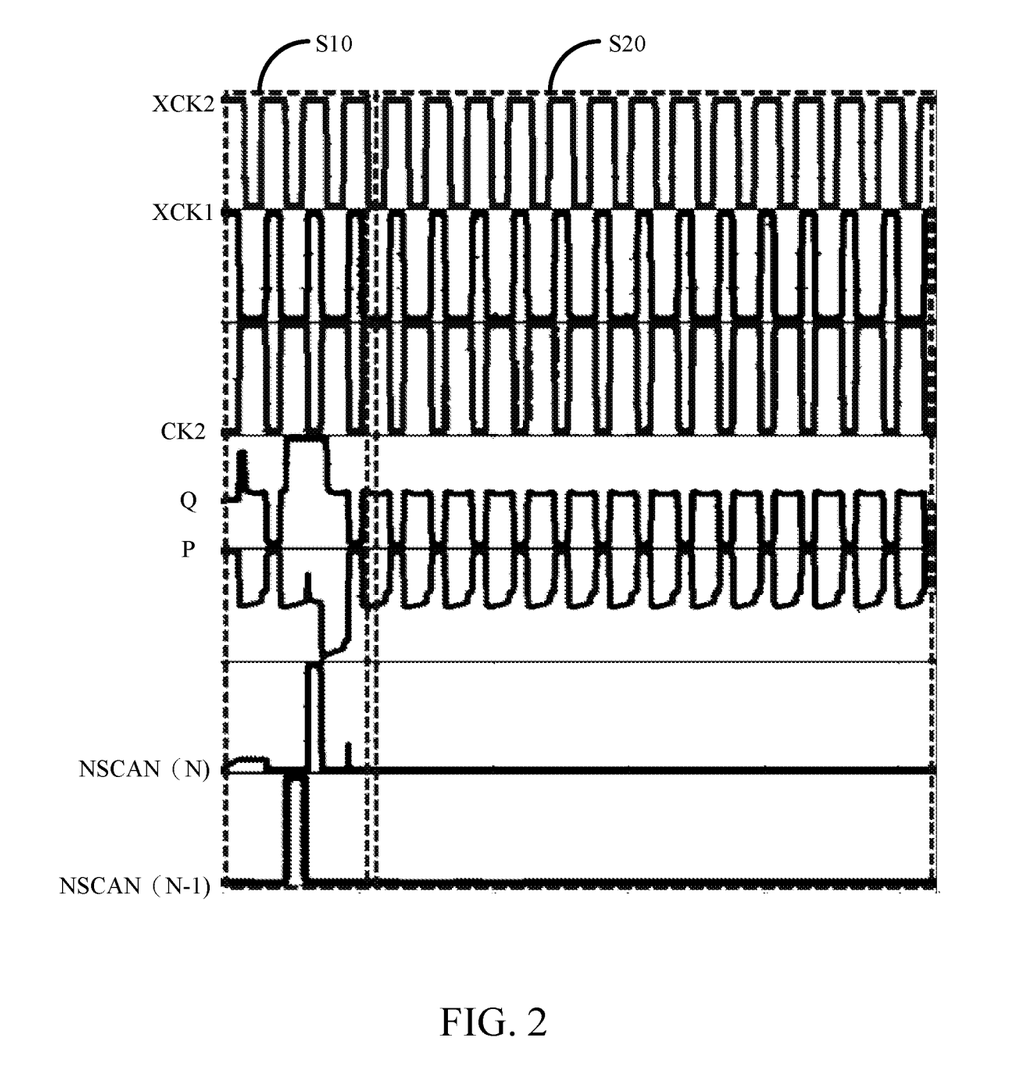
FIG. 2 illustrates a timing diagram corresponding to the gate driver circuit in FIG. 1.

As shown in FIG. 2, based on the above-mentioned embodiment, the gate drive circuit is configured to output the corresponding (N-1)th scan signal NSCAN(N-1) and the Nth level scan signal NSCAN(N) under control of the clock signal XCK1, the clock signal XCK2, the clock signal CK2, a signal at the first node Q, and a signal at the fourth node P in stage S10 and stage S20. It can be seen from simulation waveforms of the (N-1)th scan signal NSCAN(N-1) and the Nth level scan signal NSCAN(N) that outputted effective pulses corresponding to scan signals are stable.

Figure 3:
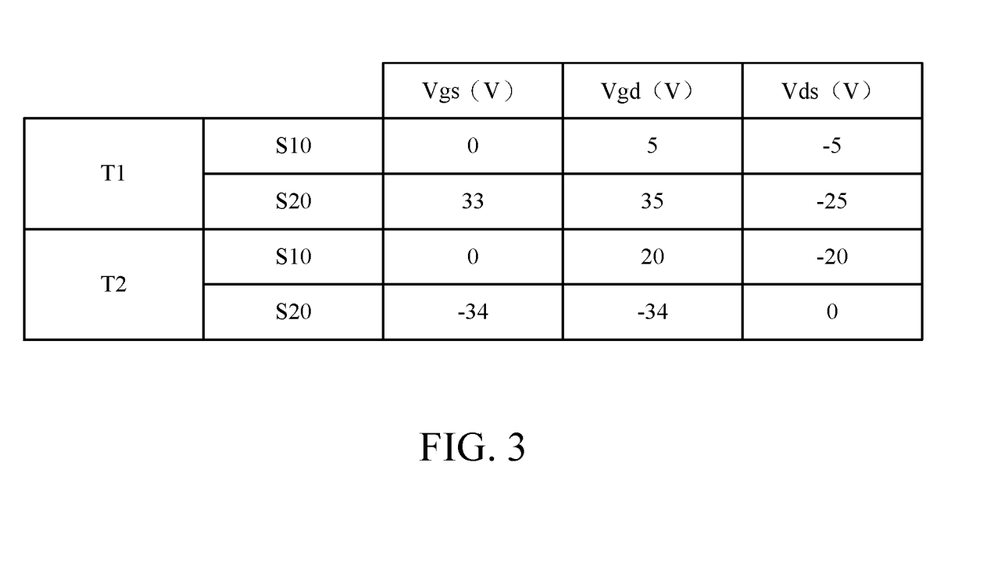
FIG. 3 illustrates a voltage change diagram of some transistors in the gate driver circuit in FIG. 1.

Correspondingly, as shown in FIG. 3, a voltage difference Vgs between the gate electrode of the second transistor T1 and the source electrode is 0V in stage S10, and a voltage difference Vgs between the gate electrode of the second transistor T1 and the source electrode is 33V in stage S20. A voltage difference Vgd between the gate electrode of the second transistor T1 and the drain electrode is 5V in stage S10, and a voltage difference Vgd between the gate electrode of the second transistor T1 and the drain electrode is 35V in stage S20. A voltage difference Vds between the drain electrode of the second transistor T1 and the source electrode is −5V in stage S10, and a voltage difference Vds between the drain electrode of the second transistor T1 and the source electrode is −25V in stage S20.

A voltage difference Vgs between the gate electrode of the fourth transistor T2 and the source electrode is 0V in stage S10, and a voltage difference Vgs between the gate electrode of the fourth transistor T2 and the source electrode is −34V in stage S20. A voltage difference Vgd between the gate electrode of the fourth transistor T2 and the drain electrode is 20V in stage S10, and a voltage difference Vgd between the gate electrode of the fourth transistor T2 and the drain electrode is −34V in stage S20. A voltage difference Vds between the drain electrode of the fourth transistor T2 and the source electrode is −20V in stage S10, and a voltage difference Vds between the drain electrode of the fourth transistor T2 and the source electrode is 0V in stage S20.

Accordingly, it can be determined that both the second transistor T1 and the fourth transistor T2 can be in a stable working state to improve the working stability of the gate driver circuit.

Figure 4:
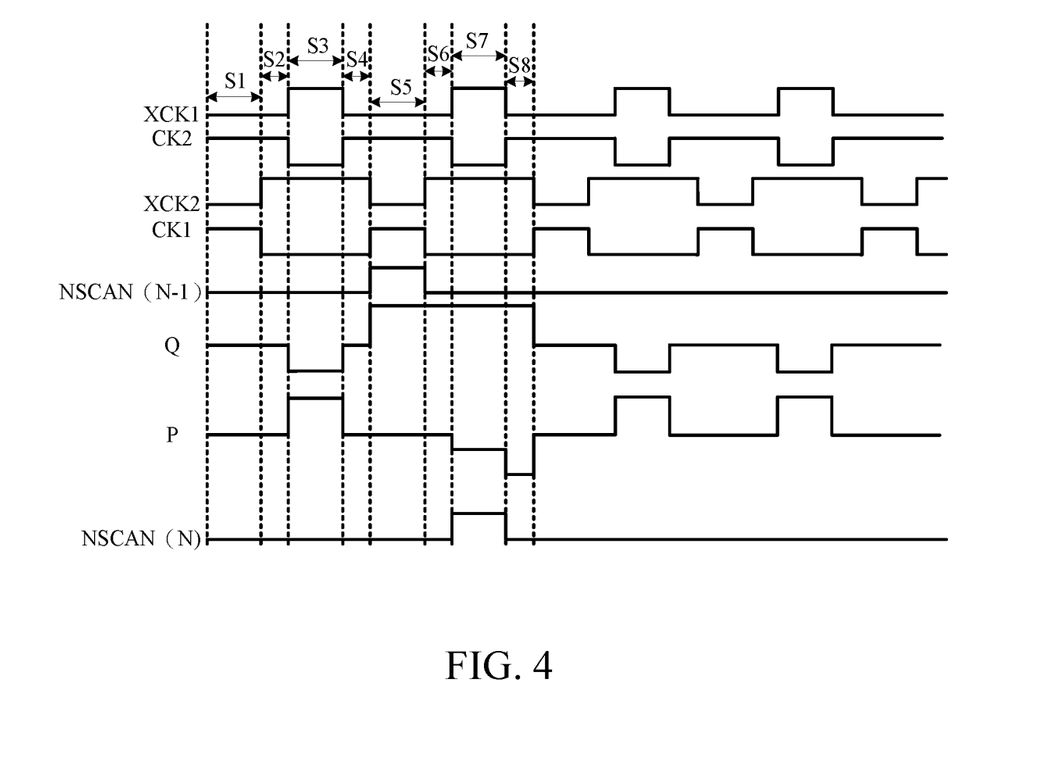
FIG. 4 illustrates another timing diagram corresponding to the gate driver circuit in FIG. 1

As shown in FIG. 4, stage S10 can also include the following stages.

In first stage S1, a low voltage level signal is inputted to the first wiring. The clock signal XCK1 and the clock signal XCK2 are both at the low voltage level. The voltage levels at the first node Q and at the fourth node P are both at the low potential but are not enough to turn on the third transistor T12 and the ninth transistor T13. At this time, the second node S is equivalent to reaming in a floating state, and the second node S still remains at the low voltage level of −9V outputted in the previous stage.

In second stage S2, the high voltage level is written into the clock signal XCK2 to turn off the fifth transistor T3 and the tenth transistor T5. The gate electrode of the sixth transistor T7 is written by +6V. Due to the coupling effect of the C2, the voltage level of the seventh transistor T8 is pulled up, and the seventh transistor T8 is turned on. At the same time, the eighth transistor T10 is turned on. The voltage level at the fourth node P remains at −4V. The third transistor T12 and the ninth transistor T13 are still in a turn-off state. The second node S is still in the floating state. The second node S keeps outputting the low voltage level of −9V.

In third stage S3, the clock signal CK2 is changed from +6V to −9V. Due to coupling effect of the C1, the voltage level at the first node Q is pulled down from −6.5V to a lower voltage level to turn on the third transistor T12. The eighth transistor T10 is turned on. The fourth node P is written by the clock signal XCK1 at the high level to turn off the ninth transistor T13. The second node S outputs the low voltage level of −9V.

In fourth stage S4, a high voltage level needs to be written into the first wiring in a next stage. The clock signal XCK2 needs to advance to be turned off. The clock signal CK2 is changed to be the high voltage level. The voltage level at the first node Q is recovered to −6.5V. The clock signal XCK1 is changed to −9V. The voltage level at the fourth node P remains at −4V. The second node S is in the floating state. The second node S keeps outputting the low voltage level of −9V.

In fifth stage S5, the high voltage level signal is written into the first wiring. The clock signal XCK1 and the clock signal XCK2 are both the low voltage level signals L. The first transistor T11, the second transistor T1, and the fifth transistor T3 are all turned on. The first node Q is written by +6V. The third transistor T12 is turned off. The eighth transistor T10 is turned off. Due to the effect of the C3, the fourth node P remains unchanged, that is, at −4V in the previous stage. The second node S remains in the floating state. The second node S continues to output the low voltage level of −9V.

In sixth stage S6, the high voltage level of the clock signal XCK1 is in a stage before being written. The clock signal needs to advance to be turned off to remain the stability of the voltage level at the fourth node P. The second transistor T1 and the fifth transistor T3 are both turned off. The first node Q and the fourth node P remain at the same voltage level in the previous stage. The second node S continues to output the low voltage level of −9V.

In seventh stage S7, the voltage level state of the clock signal XCK1 is in a writing stage. The clock signal CK2 is changed to −9V. The voltage level at the gate electrode of the sixth transistor T7 is pulled down to a lower value via the coupling of the C2. The sixth transistor T7 is turned on. At the same time, the seventh transistor T8 is turned on. The fourth node P outputs a voltage level of −6.5V. The clock signal XCK1 is changed to +6V. The ninth transistor T13 is fully turned on. The second node S outputs a high voltage level of +6V.

In eighth stage S8, the clock signal XCK1 is changed from +6V to −9V. The voltage level at the fourth node P is pulled down to a lower value via the C3, so that the ninth transistor T13 continues to remain in the turn-on state. The second node S can output the clock signal XCK1 at the low voltage level. Accordingly, one complete pulse output of the clock signal XCK1 at the high voltage level is completed.

Figure 5:
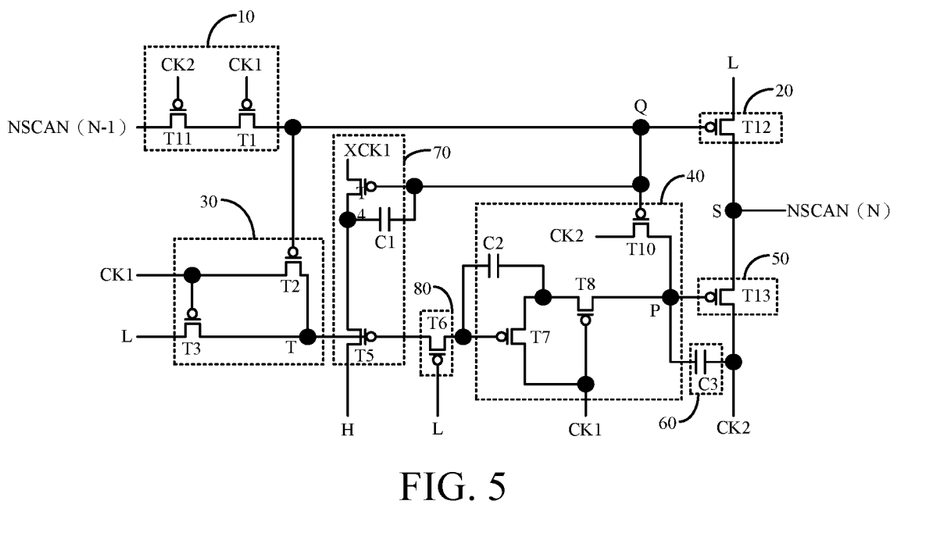
FIG. 5 illustrates another structural diagram of a gate driver circuit provided by one embodiment of the present disclosure.

In one embodiment, as shown in FIG. 5, when compared with Nth stage gate driving unit, in an (N+1)th stage gate driving unit, a second wiring can be configured to transmit the clock signal CK2, a third wiring can be configured to transmit the clock signal CK1, and a fifth wiring can be configured to transmit the clock signal XCK1.

It can be understood that the gate driver circuit provided by the present embodiment can improve stability of a voltage level of an output signal of the gate driver circuit by increasing stability of a voltage level at the fourth node P via the first pull-up voltage stabilizing module 40 and the second pull-up voltage stabilizing module 60 and by increasing stability of a voltage level at the fifth node Q via the pull-down voltage stabilizing module 70. A topology of the gate driver circuit is simplified, and thus space occupied by a frame of a display panel can be reduced. This is beneficial for implementing a narrow border of the display panel.

In one embodiment, one embodiment provides a display panel, which includes the gate driver circuit in any one of the above-mentioned embodiments.

It can be understood that the display panel provided by the present embodiment can improve stability of a voltage level of an output signal of the gate driver circuit by increasing stability of a voltage level at the fourth node P via the first pull-up voltage stabilizing module 40 and the second pull-up voltage stabilizing module 60 and by increasing stability of a voltage level at the fifth node Q via the pull-down voltage stabilizing module 70. A topology of the gate driver circuit is simplified, and thus space occupied by a frame of the display panel can be reduced. This is beneficial for implementing a narrow border of the display panel.

It should be noted that the display panel in the present embodiment can be an active-matrix organic light-emitting diode (AMOLED) display screen, which can be widely used in some electronic devices which require display functions, for example, mobile phones.

In one embodiment, the display panel can further include a pixel circuit. The pixel circuit can include polysilicon thin film transistors and oxide thin film transistors. The gate driver circuit in any one of the above-mentioned embodiments can be electrically connected to the pixel circuit and configured to use the Nth stage scan signal at the high voltage level to turn on corresponding oxide thin film transistors.

It should be noted that since the polysilicon thin film transistors and the oxide thin film transistors in the pixel circuit of the present embodiment are constructed by adopting cooperative technology. A dynamic ability is high, and a leakage current is small. Accordingly, the pixel circuit can be worked in low power consumption. When the pixel circuit is used in a mobile phone, portable and long battery life characteristics required by the mobile phone can be met.

It should be understood that those skilled in the art can make equivalent replacements or variations according to the technical solutions and inventive concepts of the present disclosure. All the variations or replacements shall fall with the scope of the appended claims.

What is claimed is:

1. A gate driver circuit, the gate driver circuit comprising a plurality of gate driving units which are cascaded, each of the gate driving units configured to output a corresponding scan signal, wherein each of the gate driving units comprises:
a first wiring;
a second wiring;
a third wiring;
a fourth wiring;
a fifth wiring;
a sixth wiring;
a pull-down control module, an input terminal of the pull-down control module electrically connected to the first wiring, a control terminal of the pull-down control module electrically connected to the second wiring and the third wiring, and an output terminal of the pull-down control module electrically connected to a first node;
a pull-down module, a control terminal of the pull-down module electrically connected to the first node, an input terminal of the pull-down module electrically connected to the fourth wiring, and an output terminal of the pull-down module electrically connected to a second node to output the corresponding scan signal;
a pull-up control module, an input terminal of the pull-up control module electrically connected to the third wiring and the fourth wiring, a control terminal of the pull-up control module electrically connected to the first node and the third wiring, and an output terminal of the pull-up control module electrically connected to a third node;
a first pull-up voltage stabilizing module, an input terminal of the first pull-up voltage stabilizing module electrically connected to the second wiring and the third wiring, a control terminal of the first pull-up voltage stabilizing module electrically connected to the first node, the third node, and the third wiring, and an output terminal of the first pull-up voltage stabilizing module electrically connected to a fourth node;
a pull-up module, an input terminal of the pull-up module electrically connected to the second wiring, a control terminal of the pull-up module electrically connected to the fourth node, and an output terminal of the pull-up module electrically connected to the second node;
a second pull-up voltage stabilizing module, one terminal of the second pull-up voltage stabilizing module electrically connected to the second wiring, and the other terminal of the second pull-up voltage stabilizing module electrically connected to the fourth node; and a pull-down voltage stabilizing module, an input terminal of the pull-down voltage stabilizing module electrically connected to the fifth wiring and the sixth wiring, a control terminal of the pull-down voltage stabilizing module electrically connected to the first node and the third node, and an output terminal of the pull-down voltage stabilizing module electrically connected to the first node.

2. The gate driver circuit of claim 1, wherein the pull-down control module comprises:

a first transistor, one of source/drain electrodes of the first transistor electrically connected to the first wiring, and a gate electrode of the first transistor electrically connected to the second wiring; and a second transistor, one of source/drain electrodes of the second transistor electrically connected to the other of the source/drain electrodes of the first transistor, a gate electrode of the second transistor electrically connected to the third wiring, and the other of the source/drain electrodes of the second transistor directly electrically connected to the first node.

3. The gate driver circuit of claim 1, wherein the pull-up control module comprises:

a fourth transistor, one of source/drain electrodes of the fourth transistor electrically connected to the third wiring, a gate electrode of the fourth transistor directly electrically connected to the first node, and the other of the source/drain electrodes of the fourth transistor electrically connected to the third node; and a fifth transistor, one of source/drain electrodes of the fifth transistor electrically connected to the fourth wiring, a gate of the fifth transistor electrically connected to the third wiring, and the other of the source/drain electrodes of the fifth transistor electrically connected to the third node.

4. The gate driver circuit of claim 3, wherein the fourth transistor and the fifth transistor are P-channel type thin film transistors.

5. The gate driver circuit of claim 1, wherein the pull-down module comprises:

a third transistor, a gate electrode of the third transistor electrically connected to the first node, one of source/drain electrodes of the third transistor electrically connected to the fourth wiring, and the other of the source/drain electrodes of the third transistor electrically connected to the second node.

6. The gate driver circuit of claim 1, wherein the first pull-up voltage stabilizing module comprises:

a sixth transistor, one of source/drain electrodes of the sixth transistor electrically connected to the third wiring, and a gate electrode of the sixth transistor electrically connected to the third node;

a seventh transistor, one of source/drain electrodes of the seventh transistor electrically connected to the other of the source/drain electrodes of the sixth transistor, a gate electrode of the seventh transistor electrically connected to the third wiring, and the other of the source/drain electrodes of the seventh transistor electrically connected to the fourth node;

an eighth transistor, one of source/drain electrodes of the eighth transistor electrically connected to the second wiring, a gate of the eighth transistor electrically connected to the first node, and the other of the source/drain electrodes of the eighth transistor electrically connected to the fourth node; and a first capacitor, one terminal of the first capacitor electrically connected to the gate electrode of the sixth transistor, and the other terminal of the first capacitor electrically connected to the other of the source/drain electrodes of the sixth transistor.

7. The gate driver circuit of claim 1, wherein the pull-down stabilizing module comprises:

a tenth transistor, one of source/drain electrodes of the tenth transistor electrically connected to the sixth wiring, and a gate electrode of the tenth transistor electrically connected to the third node;

an eleventh transistor, one of source/drain electrodes of the eleventh transistor electrically connected to the other of the source/drain electrodes of the tenth transistor, a gate electrode of the eleventh transistor electrically connected to the first node, and the other of the source/drain electrodes of the eleventh transistor electrically connected to the fifth wiring; and a third capacitor, one terminal of the third capacitor electrically connected to the one of the source/drain electrodes of the eleventh transistor, and the other terminal of the third capacitor electrically connected to the first node.

8. The gate driver circuit of claim 1, wherein the pull-up module comprises:

a ninth transistor, one of source/drain electrodes of the ninth transistor electrically connected to the second wiring, a gate electrode of the ninth transistor connected to the fourth node, and the other of the source/drain electrodes of the ninth transistor electrically connected to the second node.

9. The gate driver circuit of claim 1, wherein the second pull-up voltage stabilizing module comprises:

a second capacitor, a first terminal of the second capacitor electrically connected to the second wiring, and a second terminal of the second capacitor electrically connected to the fourth node.

10. A display panel, comprising the gate driver circuit of claim 1, wherein the gate driver circuit further comprises:

a voltage stabilizing isolation module, an input terminal of the stabilizing isolation module electrically connected to the third node, a control terminal of the voltage stabilizing isolation module electrically connected to the fourth wiring, and an output terminal of the voltage stabilizing isolation module electrically connected to the first pull-up voltage stabilizing module.

11. The display panel of claim 10, wherein the voltage stabilizing isolation module comprises:

a twelfth transistor, one of source/drain electrodes of the twelfth transistor electrically connected to the third node, a gate electrode of the twelfth transistor electrically connected to the fourth wiring, and the other of the source/drain of the twelfth transistor electrically connected to the first pull-up voltage stabilizing module.

12. The display panel of claim 10, wherein the pull-down control module comprises:

a first transistor, one of source/drain electrodes of the first transistor electrically connected to the first wiring, and a gate electrode of the first transistor electrically connected to the second wiring; and a second transistor, one of source/drain electrodes of the second transistor electrically connected to the other of the source/drain electrodes of the first transistor, a gate electrode of the second transistor electrically connected to the third wiring, and the other of the source/drain electrodes of the second transistor directly electrically connected to the first node.

13. The display panel of claim 10, wherein the pull-up control module comprises:
   a fourth transistor, one of source/drain electrodes of the fourth transistor electrically connected to the third wiring, a gate electrode of the fourth transistor directly electrically connected to the first node, and the other of the source/drain electrodes of the fourth transistor electrically connected to the third node; and
   a fifth transistor, one of source/drain electrodes of the fifth transistor electrically connected to the fourth wiring, a gate of the fifth transistor electrically connected to the third wiring, and the other of the source/drain electrodes of the fifth transistor electrically connected to the third node.

14. The display panel of claim 13, wherein the fourth transistor and the fifth transistor are P-channel type thin film transistors.

15. The display panel of claim 10, wherein the pull-down module comprises:
   a third transistor a first control module, a gate electrode of the third transistor electrically connected to the first node, one of source/drain electrodes of the third transistor connected to the fourth wiring, and the other of the source/drain electrodes of the third transistor electrically connected to the second node.

16. The display panel of claim 10, wherein the first pull-up voltage stabilizing module comprises:
   a sixth transistor, one of source/drain electrodes of the sixth transistor electrically connected to the third wiring, and a gate electrode of the sixth transistor electrically connected to the third node;
   a seventh transistor, one of source/drain electrodes of the seventh transistor electrically connected to the other of the source/drain electrodes of the sixth transistor, a gate electrode of the seventh transistor electrically connected to the third wiring, and the other of the source/drain electrodes of the seventh transistor electrically connected to the fourth node;
   an eighth transistor, one of source/drain electrodes of the eighth transistor electrically connected to the second wiring, a gate of the eighth transistor electrically connected to the first node, and the other of the source/drain electrodes of the eighth transistor electrically connected to the fourth node; and
   a first capacitor, one terminal of the first capacitor electrically connected to the gate electrode of the sixth transistor, and the other terminal of the first capacitor electrically connected to the other of the source/drain electrodes of the sixth transistor.

17. The display panel of claim 10, wherein the pull-down stabilizing module comprises:
   a tenth transistor, one of source/drain electrodes of the tenth transistor electrically connected to the sixth wiring, and a gate electrode of the tenth transistor electrically connected to the third node;
   an eleventh transistor, one of source/drain electrodes of the eleventh transistor electrically connected to the other of the source/drain electrodes of the tenth transistor, a gate electrode of the eleventh transistor electrically connected to the first node, and the other of the source/drain electrodes of the eleventh transistor electrically connected to the fifth wiring; and
   a third capacitor, one terminal of the third capacitor electrically connected to the one of the source/drain electrodes of the eleventh transistor, and the other terminal of the third capacitor electrically connected to the first node.

18. The display panel of claim 10, wherein the pull-up module comprises:
   a ninth transistor, one of source/drain electrodes of the ninth transistor electrically connected to the second wiring, a gate electrode of the ninth transistor connected to the fourth node, and the other of the source/drain electrodes of the ninth transistor electrically connected to the second node.

19. The display panel of claim 18, wherein the ninth transistor is a P-channel type thin film transistor.

20. The display panel of claim 10, wherein the second pull-up voltage stabilizing module comprises:
   a second capacitor, a first terminal of the second capacitor electrically connected to the second wiring, and a second terminal of the second capacitor electrically connected to the fourth node.

* * * * *